United States Patent
Grebs et al.

(10) Patent No.: US 6,680,232 B2
(45) Date of Patent: Jan. 20, 2004

(54) TRENCH ETCH WITH INCREMENTAL OXYGEN FLOW

(75) Inventors: Thomas E. Grebs, Mountaintop, PA (US); Joseph L. Cumbo, West Wyoming, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 102 days.

(21) Appl. No.: 09/956,568

(22) Filed: Sep. 19, 2001

(65) Prior Publication Data

US 2002/0061621 A1 May 23, 2002

Related U.S. Application Data

(63) Continuation-in-part of application No. 09/797,323, filed on Mar. 1, 2001.
(60) Provisional application No. 60/234,563, filed on Sep. 22, 2000.

(51) Int. Cl.[7] .............................................. H01L 21/336
(52) U.S. Cl. ........................ 438/270; 438/589; 438/702; 438/714; 438/719; 438/958; 438/978
(58) Field of Search .................................. 438/270, 589, 438/700–702, 713, 719, 714, 958, 978, FOR 117, FOR 118, FOR 192, FOR 193, FOR 176, FOR 458, FOR 492

(56) References Cited

U.S. PATENT DOCUMENTS

| 5,077,228 | A | * | 12/1991 | Eklund et al. ............... 438/202 |
| 5,607,875 | A | * | 3/1997 | Nishizawa et al. .. 148/DIG. 50 |
| 5,777,362 | A | | 7/1998 | Pearce |
| 5,807,783 | A | * | 9/1998 | Gaul et al. ................... 438/406 |
| 5,828,101 | A | * | 10/1998 | Endo ........................... 257/330 |
| 5,920,108 | A | | 7/1999 | Hemmenway et al. |
| 6,020,270 | A | * | 2/2000 | Wong et al. ................... 216/67 |
| 6,130,458 | A | * | 10/2000 | Takagi et al. ............... 257/341 |
| 6,514,857 | B1 | * | 2/2003 | Naik et al. ................... 438/638 |

* cited by examiner

*Primary Examiner*—George Fourson
*Assistant Examiner*—Michelle Estrada
(74) *Attorney, Agent, or Firm*—Thomas R. Fitzgerald, Esq.

(57) ABSTRACT

A method for forming trenches in a device layer disposed on a silicon semiconductor substrate comprises: covering the device layer with an etch resistant masking layer to define at least two trench regions; removing semiconductor material from the exposed trench regions by applying an etching agent that selectively etches the semiconductor substrate with respect to the trench masking layer, thereby forming at least two trenches each comprising a floor and sidewalls; and, during the removal of semiconductor material, exposing the sidewalls to a passivating agent in increasing amounts, thereby passivating the sidewalls while reducing lateral etching of semiconductor material from them.

14 Claims, 4 Drawing Sheets

TRENCH ETCH WITH INCREMENTAL OXYGEN FLOW

CROSS-REFERENCE TO RELATED APPLICATIONS

This application, which is a continuation-in-part of U.S. application Ser. No. 09/797,323, filed Mar. 1, 2001, claims the benefit of U.S. Provisional Application Serial No. 60/234,563, filed Sep. 22, 2000.

BACKGROUND OF THE INVENTION

Cross-sectional SEMs of trench structures show that as the pitch of the device increases greater than 1.5 μm, the sidewall profiles can change from a favorable to a non-favorable, re-entrant shape, as shown by a comparison of FIGS. 1 and 2. FIG. 1 depicts a trench device structure 100 whose etched trenches 101 have a pitch of 1.5 μm. Trenches 101 are lined with gate oxide 102 and filled with doped polysilicon 103 and BPSG dielectric 104. When the pitch is 1.5 μm or less, the filled trenches exhibit void-free fills. Such trench structures are found in integrated circuits and are used for isolation and for gates in quasi vertical DMOS (QVDOMS) devices.

As the pitch increases greater than 1.5 μm, the trench profile becomes re-entrant, i.e., the sidewalls become non-parallel as a consequence of insufficient oxygen being present during plasma etching of the trenches. FIG. 2 depicts a trench device structure 200 whose etched trenches 201 have a pitch of 3.0 μm. Trenches 201 are lined with gate oxide 202 and filled with doped polysilicon 203 and BPSG dielectric 204. However voids resulting from incomplete fill are formed in the subsequent polysilicon and BPSG films 203 and 204, respectively, which adversely affects device yield. In particular, the voids lead to rupture of the gate oxide, resulting in shorting of gate-to-source current ($I_{gss}$). FIG. 3 shows a BPSG film 204 with voids 205 that lead to an $I_{gss}$ failure.

Lateral etching of the silicon during trench formation is commonly referred to as "bowing". The bowing effect of lateral etching is shown in FIG. 2, where the upper portions 201a of trenches are substantially narrower than the lower trench portions 201b.

SUMMARY OF THE INVENTION

The present invention is directed to a method for forming trenches in a device layer disposed on a silicon semiconductor substrate. The method comprises: covering the device layer with an etch resistant masking layer to define at least two trench regions; removing semiconductor material from the exposed trench regions by applying an etching agent that selectively etches the semiconductor substrate with respect to the trench masking layer, thereby forming at least two trenches each comprising a floor and sidewalls; and, during the removal of semiconductor material, exposing the sidewalls to a passivating agent in increasing amounts with time, thereby passivating the sidewalls while reducing lateral etching of semiconductor material from them.

DETAILED DESCRIPTION OF THE INVENTION

In the process of the present invention, the etching agent is selected from the group consisting of chlorine, sulfur hexafluoride, and nitrogen trifluoride, and the passivating agent is selected from the group consisting of oxygen, oxygen-containing compounds, hydrogen bromide, helium, and mixtures thereof. Preferably, the etching agent is sulfur hexafluoride, and the passivating agent is oxygen.

In order to reduce the effects of the re-entrant profiles, it was found that the oxygen gas flow controls the amount of sidewall passivation generated to control the lateral etch of the silicon. A trench mask pattern is formed on the surface of semiconductor substrate having an integrated circuit. The circuit may be formed before, after, or during creation of the trench, depending upon the function (isolation or gate) of the trench. A trench mask pattern of an etch resistant layer is formed over the substrate, with openings defining the trenches. The etch resistant making layer may be formed by chemical vapor deposition, or it may comprise deposited organic material. Preferably, the etch resistant masking layer is selected from the group of materials consisting of low temperature oxide, CVD oxide, thermally grown oxide, CVD nitride, oxynitride, borophosphosilicate glass, a photosensitive material, a polyimide, and a photoresist. For a plasma silicon etch operation, a typical resist structure comprises a low temperature oxide.

During plasma etching, oxygen flow is decreased significantly (by 56%, from 34 to 15 sccm) and causes the silicon to have an etch bias of 0.25 um from an LTO opening of 0.45 um for wide pitch designs, as compared to 0.05 μm for narrow (1.5 um) pitch designs. The oxygen ions tend to passivate the walls of the trench. However, fluorine ions from the $SF_6$ gas etch silicon at a much faster rate than the oxygen ions can passivate the silicon sidewall, thus preventing lateral etching. One would think that this lateral etch could be prevented if a higher oxygen flow were used. However, it is observed that etching with high oxygen flow over-passivates the trench and produces unwanted negative artifacts, i.e., "grass", resulting in rough surfaces. The surfaces of these trenches are used to form the gate oxide, but with very rough surfaces the gate oxide quality is degraded and leads to device failure.

Figure 1:
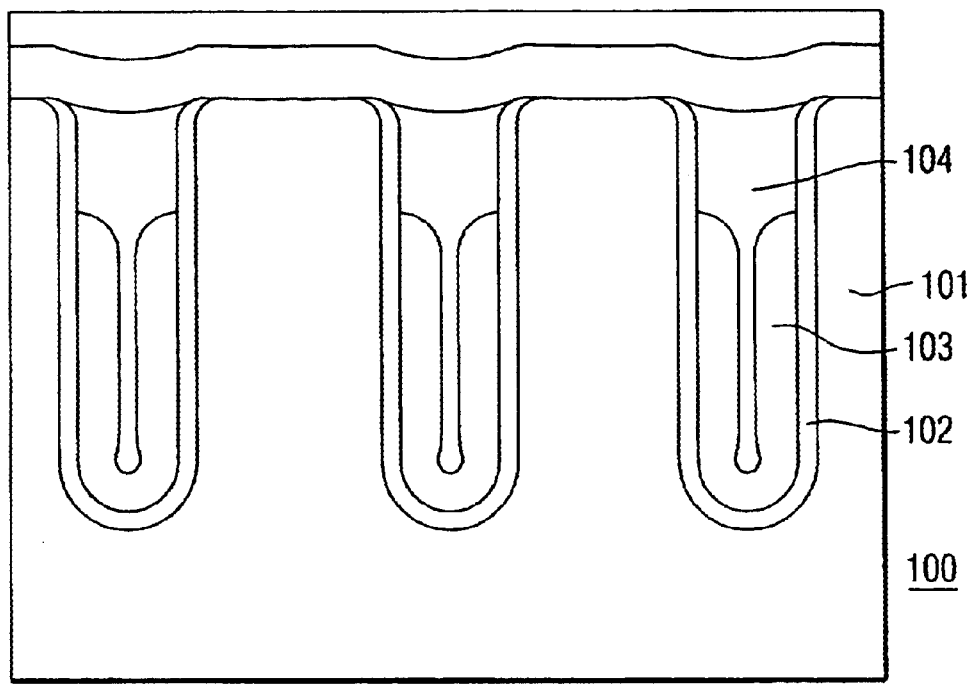
FIG. 1 shows a prior art trench device with a pitch of about 1.5 μm.
Figure 2:
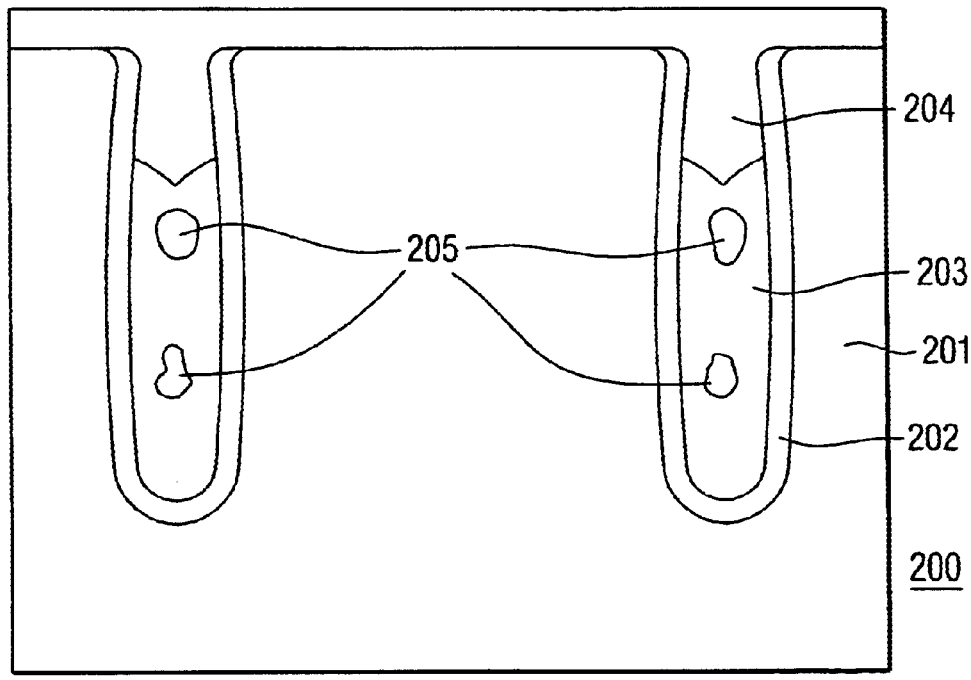
FIG. 2 shows a prior art trench device with a pitch of about 3.0 μm.
Figure 3:
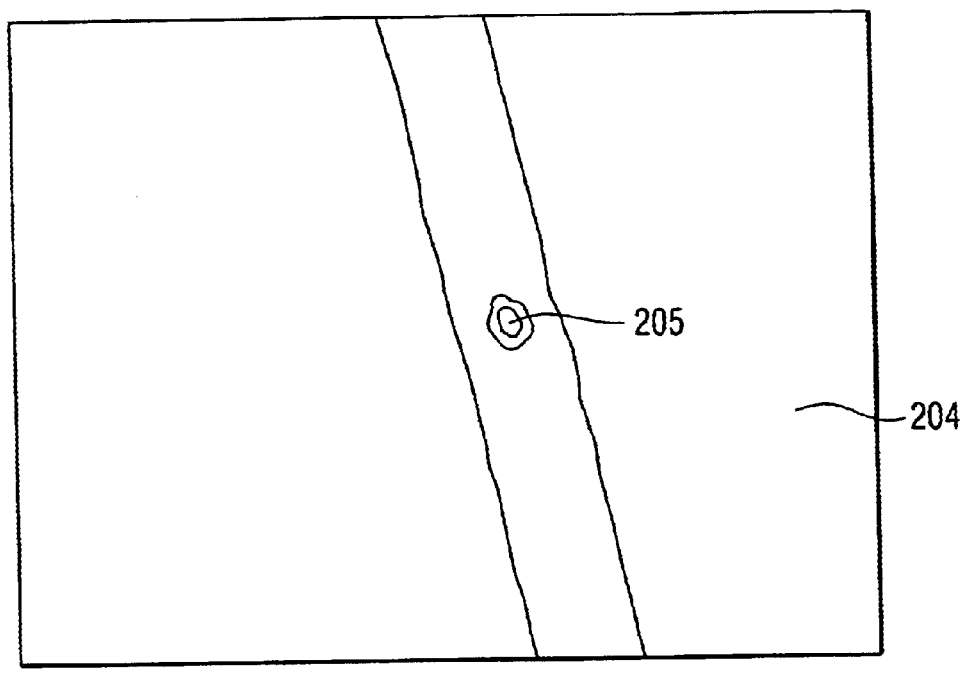
FIG. 3 shows a prior art trench device with a BPSG film and voids.
Figure 4:
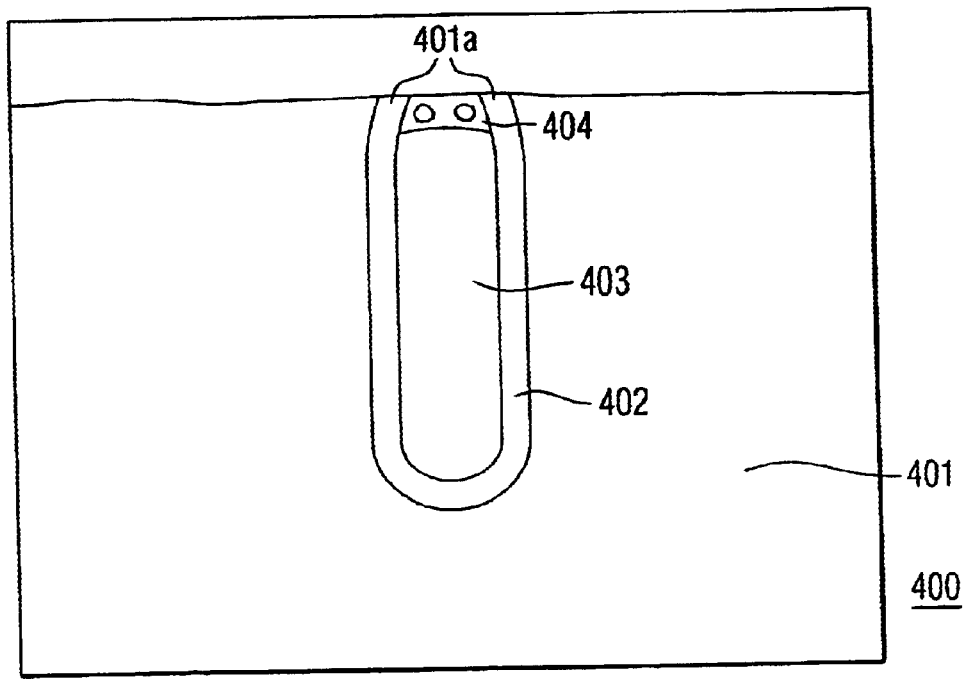
FIG. 4 show a large-pitch prior art trench device etched with high oxygen flow and containing no re-entrant profiles or voids.

Trenches having a large pitch, for example, 3.0 μm, can be formed by etching under conditions of low oxygen flow. FIG. 4 depicts a trench device structure 400 whose etched trenches 401 have a pitch of 3.0 μm. Trenches 401 are lined with gate oxide 402 and filled with films of doped polysilicon 403 and BPSG dielectric 404. However the sidewalls of upper trench portion 401a bend inwards to cause a constriction, resulting in voids in BPSG dielectric 404.

The process of the present invention divides the main etch step of the trench etch into multiple segments. The oxygen flow is increased by, for example, 5 sccm in each segment, while the other etch parameters are maintained at their conventional respective settings. The amount of time may be held substantially equal for each segment or the etching procedure. However the time intervals may also be adjusted during the course of the etching as one determines the need to add more sidewall passivation to prevent lateral etching of the silicon. Ramping the oxygen gas flow in discrete intervals prevents grass formation, resulting in acceptable gate oxide quality with trench profiles and widths that are not re-entrant and over-sized. It is likely that the oxygen can be continuously increased to produce similar results.

Figure 5:
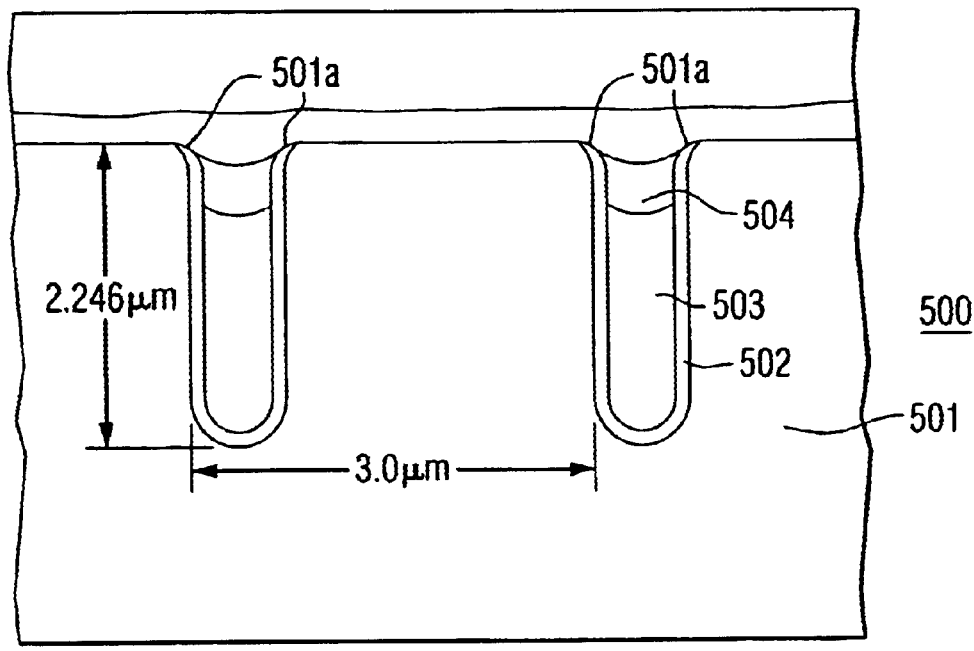
FIG. 5 depicts a large-pitch trench device etched by the process of the present invention.
Figure 6:
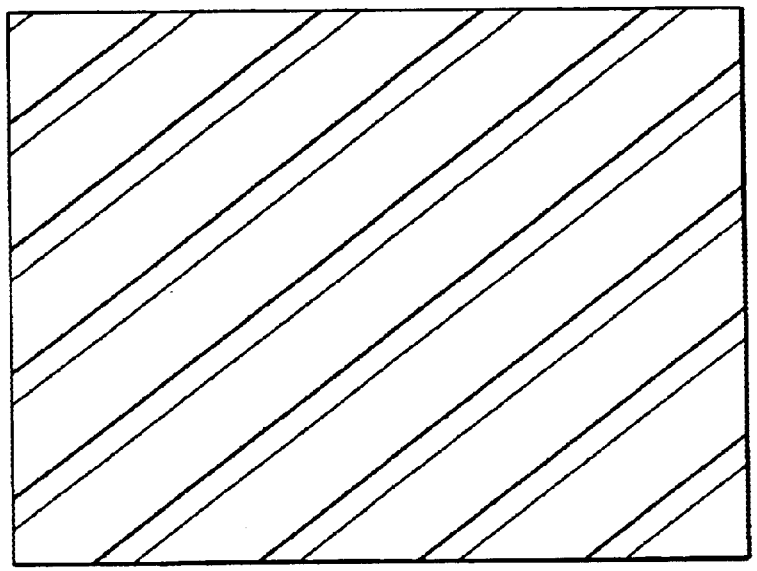
FIG. 6 is a top view of a multiple trench device of the present invention having no voids in the BPSG layer.

FIG. 5 depicts a trench device structure 500, formed in accordance with the present invention, with etched trenches 501 having a pitch of 3.0 µm. Trenches 501 are lined with gate oxide 502 and filled with films of doped polysilicon 503 and BPSG dielectric 504 that contain no voids. As shown in FIG. 6, the BPSG dielectric is void-free, thereby reducing the risk of $I_{gss}$ failures. Preferably, the etching process comprises isotropic plasma etching of an upper portion 501*a* of trenches 501, resulting in a desirable outward flaring of portions 501*a*.

A typical etch recipe is shown in Table 1. That process and recipe causes re-entrant trench profiles when etching trenches that have pitches wider than 1.5 µm. The process of the present invention includes a multi-step etch recipe that provides for increased oxygen flow at each step and produces trenches with a desirable profile, even where the trench pitch is greater than 1.5 µm. The process parameters are shown in Table 2. Oxygen gas flow rates and times can be adjusted to maintain a positive slope to the trench profiles to prevent any bowing from occurring.

Figure 7:
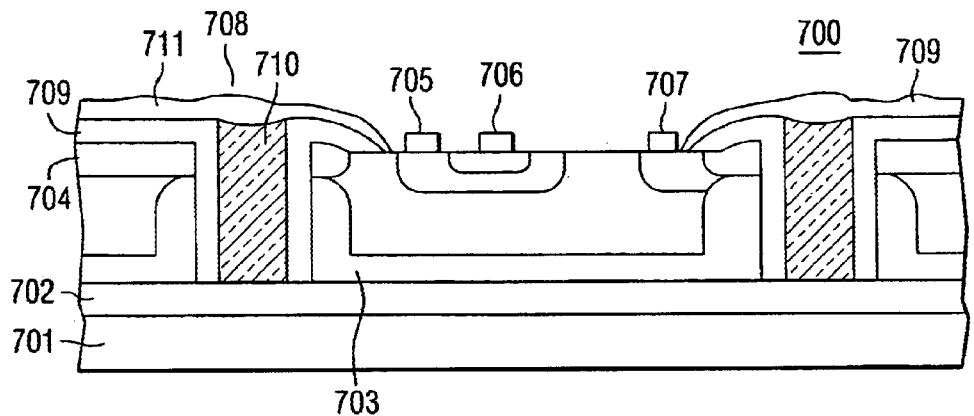
FIG. 7 is a schematic view of an integrated circuit having an isolation trench formed by the process of the present invention.

The plasma etching of the trenches was carried out using a Lam PCP Model 9400 SE plasma etching apparatus, available from Lam Research.

other semiconductor technologies and to various pitches and trench widths. The process and the resulting trenches are applicable to discrete devices and to integrated circuits. The trenches formed by the process of the invention may be isolation trenches or gate trenches. An isolation trench for an integrated circuit is described in U.S. Pat. No. 5,920,108, the disclosure of which is incorporated herein by reference. FIG. 7 depicts a bipolar device 700 that includes a handle wafer 701 and an insulating layer 702, on which is formed a device having a heavily doped buried layer 703, a LOCOS oxide layer 704, a base 705, an emitter 706, and a collector 707. Gate trench 708 is etched by the process of the present invention and subsequently lined with gate oxide 709 and filled with doped polysilicon 710, over which is formed dielectric 711.

Figure 8:
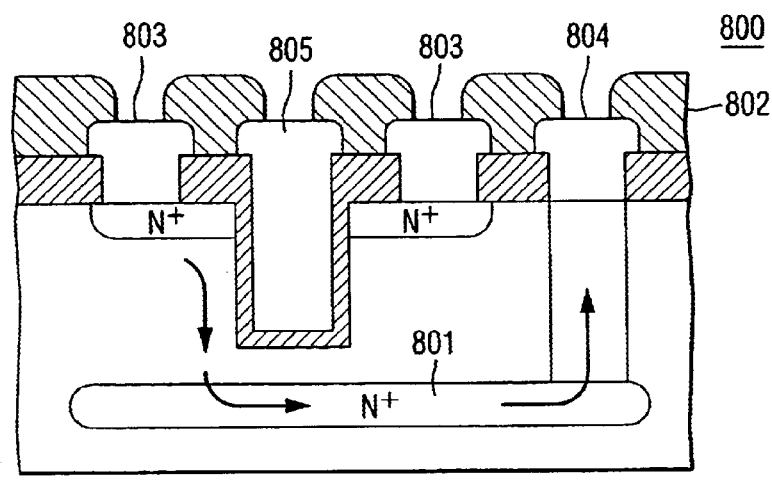
FIG. 8 is a schematic view of an integrated circuit with a QVDMOS formed by the trench etching process of the present invention.

A quasi-vertical DMOS device (QVDMOS) is described in U.S. Pat. No. 5,777,362, the disclosure of which is incorporated herein by reference. FIG. 8 depicts a QVDMOS 800 that includes a heavily doped buried layer 801, an oxide layer 802 a source 803, a drain 804, and a trench gate 805 formed in a trench etched by the process of the present invention. The individual QVDMOS devices may be isolated with trenches formed by the same process as the one used to form the gate trench.

The invention has been described in detail with particular reference to preferred embodiments thereof, but it will be understood that variations and modifications can be effected with the spirit and scope of the invention, which is defined by the claims that follow.

What is claimed:

1. A method for forming trenches in a device layer disposed on a silicon semiconductor substrate, said method comprising:

covering the device layer with an etch resistant masking layer to define at least two trench regions;

TABLE 1

Standard prior art etch recipe used for 1.5 µm-pitch trench devices

|  | Stability | Breakthrough | Stability | Begin Ignition | Main Etch |
| --- | --- | --- | --- | --- | --- |
| Pressure (mTorr) | 10 | 10 | 80 | 80 | 80 |
| Top Power (W) | 0 | 300 | 0 | 500 | 500 |
| Bottom Power (W) | 0 | 100 | 0 | 25 | 25 |
| Cl$_2$ (sccm) | 100 | 100 | 0 | 0 | 0 |
| O$_2$ (sccm) | 0 | 0 | 34 | 34 | 34 |
| He (sccm) | 0 | 0 | 280 | 280 | 280 |
| SF$_6$ (sccm) | 0 | 0 | 0 | 0 | 46 |
| Time (sec) | 30 | 10 | 20 | 7 | 60 |

TABLE 2

Multi-step etch recipe used for >1.5 µm-pitch trench devices

|  | Stability | BT | Stability | Begin Ignition | Etch 1 | Etch 2 | Etch 3 | Etch 4 | Etch 5 | Etch 6 | Etch 7 | Etch 8 |
| --- | --- | --- | --- | --- | --- | --- | --- | --- | --- | --- | --- | --- |
| Pressure (mTorr) | 10 | 10 | 60 | 60 | 60 | 60 | 60 | 60 | 60 | 60 | 60 | 60 |
| Top Power (W) | 0 | 30 | 0 | 500 | 500 | 500 | 500 | 500 | 500 | 500 | 500 | 500 |
| Bottom Power (W) | 0 | 10 | 0 | 25 | 25 | 25 | 25 | 25 | 25 | 25 | 25 | 25 |
| Cl$_2$ (sccm) | 100 | 100 | 0 | 0 | 0 | 0 | 0 | 0 | 0 | 0 | 0 | 0 |
| O$_2$ (sccm) | 0 | 0 | 35 | 35 | 35 | 40 | 45 | 50 | 55 | 60 | 65 | 70 |
| He (sccm) | 0 | 0 | 280 | 280 | 280 | 280 | 280 | 280 | 280 | 280 | 280 | 280 |
| SF$_6$ (sccm) | 0 | 0 | 0 | 0 | 46 | 46 | 46 | 46 | 46 | 46 | 46 | 46 |
| Time (sec) | 30 | 10 | 20 | 7 | 5 | 5 | 5 | 5 | 5 | 5 | 5 | 5 |

Although this innovation has been demonstrated for N-channel dense trench technology, it can be applied to removing semiconductor material from the exposed trench regions by applying an etching agent selected from the group consisting of chlorine, sulfur hexafluoride, and nitrogen that selectively etches the semiconductor substrate with respect to the trench masking layer, thereby forming at least two trenches each comprising a floor and sidewalls; and during said removing of semiconductor material, exposing said sidewalls to a passivating agent selected from the group consisting of oxygen, oxygen-containing compounds, hydrogen bromide, helium, and mixtures thereof in increasing amounts with time, thereby passivating said sidewalls while reducing lateral etching of semiconductor material from said sidewalls.

2. The method of claim 1 wherein said etching agent is sulfur hexafluoride and said passivating agent is oxygen.

3. The method of claim 1 wherein the amount of passivating agent is increased in discrete steps comprising substantially equal time intervals.

4. The method of claim 1 wherein the amount of passivating agent is increased in discrete steps comprising controlled time intervals of varying duration.

5. The method of claim 1 wherein said trenches comprise isolation trenches or gate trenches for a QVDMOS device.

6. The method of claim 1 wherein said trenches have a pitch of 1.5 um or more.

7. The method of claim 1 wherein said etching further comprises isotropic plasma etching of an upper portion of said trenches.

8. The method of claim 1 wherein said etch resistant masking layer is formed by chemical vapor deposition.

9. The method of claim 1 wherein said etch resistant masking layer comprises deposited organic material.

10. The method of claim 1 wherein said etch resistant masking layer is selected from the group of materials consisting of low temperature oxide, CVD oxide, thermally grown oxide, CVD nitride, oxynitride, borophosphosilicate glass, a photosensitive material, a polyimide, and a photoresist.

11. The method of claim 10 wherein said etch resistant masking layer is formed from low temperature oxide.

12. The method of claim 1 wherein said trenches surround an island that includes one or more semiconductor devices.

13. The method of claim 12 further comprising: forming source regions at the surface adjacent said trenches, a channel region adjacent said trenches and below said source regions, a buried highly doped layer beneath said trenches, and a conductive via from said buried layer to said surface.

14. The method of claim 1 further comprising: coating said semiconductor material in said trenches with a gate insulating layer, then depositing conductive material over said gate insulating layer, thereby forming trench gates.

* * * * *